(12) United States Patent
Leung et al.

(10) Patent No.: US 10,566,801 B2
(45) Date of Patent: Feb. 18, 2020

(54) APPARATUS, SYSTEM, AND METHOD FOR PREVENTING IMPROPER INSTALLATION OF POWER SUPPLY MODULES ON NETWORK DEVICES

(71) Applicant: Juniper Networks, Inc., Sunnyvale, CA (US)

(72) Inventors: Jimmy Chun-Chuen Leung, Freemont, CA (US); Seongchul C. Kim, San Jose, CA (US)

(73) Assignee: Juniper Networks, Inc, Sunnyvale, CA (US)

( * ) Notice: Subject to any disclaimer, the term of this patent is extended or adjusted under 35 U.S.C. 154(b) by 242 days.

(21) Appl. No.: 15/860,254

(22) Filed: Jan. 2, 2018

(65) Prior Publication Data
US 2019/0204800 A1    Jul. 4, 2019

(51) Int. Cl.
*G05B 19/048* (2006.01)
*H02J 4/00* (2006.01)
*H05K 7/02* (2006.01)
*H05K 7/14* (2006.01)
*H05K 7/18* (2006.01)
*G05B 19/05* (2006.01)

(52) U.S. Cl.
CPC ............. *H02J 4/00* (2013.01); *G05B 19/048* (2013.01); *H05K 7/023* (2013.01); *H05K 7/1455* (2013.01); *H05K 7/1457* (2013.01); *G05B 19/05* (2013.01); *G05B 2219/25318* (2013.01); *G05B 2219/2639* (2013.01); *H05K 7/18* (2013.01)

(58) Field of Classification Search
CPC .................. G05B 19/048; G05B 19/05; G05B 2219/25318; G05B 2219/2639; H02J 4/00; H05K 7/023; H05K 7/1455; H05K 7/1457; H05K 7/18
USPC .......................................................... 307/43
See application file for complete search history.

(56) References Cited

U.S. PATENT DOCUMENTS 9,301,420 B2 * 3/2016 Bailey .................. H05K 7/1492

* cited by examiner

*Primary Examiner* — Carlos Amaya
(74) *Attorney, Agent, or Firm* — FisherBroyles, LLP

(57) ABSTRACT

The disclosed apparatus may include (1) a power distribution module that (A) distributes power to a network device that forwards traffic within a network and (B) includes a series of interlock blocks keyed to (I) enable power supply modules whose electrical ratings satisfy a certain threshold to be installed to the network device and (II) prevent other power supply modules whose electrical ratings do not satisfy the certain threshold from being installed to the network device and (2) at least one power supply module that (A) has an electrical rating that satisfies the certain threshold, (B) includes a flange that is keyed to fit between the interlock blocks of the power distribution module, and when installed to the network device by way of the power distribution module, (C) provides power to the network device that forwards traffic within the network. Various other apparatuses, systems, and methods are also disclosed.

20 Claims, 11 Drawing Sheets

Compatibility Matrix 600

| PSM/PDM matrix | | PSM Designs: | | |
|---|---|---|---|---|
| PDM designs: | New 240VDC HVDC | Existing DC PSM | Existing AC PSM | New Universal HVDC/AC |
| Exisiting AC PDM | No | No | Yes | Yes |
| Exisiting 48VDC PDM | NW | Yes | No | NW |
| New 240VDC PDM | Yes | No | No | Yes |
| New 380VDC PDM | No | No | No | Yes |
| | | | | |
| Yes = must work | | | | |
| No = should not work | | | | |
| NW = would not power up | | | | |

FIG. 6

APPARATUS, SYSTEM, AND METHOD FOR PREVENTING IMPROPER INSTALLATION OF POWER SUPPLY MODULES ON NETWORK DEVICES

BACKGROUND

Network equipment vendors often design and/or manufacture a variety of different device components that are incorporated into network devices. Some of these device components may look similar to one another but perform different functions and/or have certain incompatibilities relative to one another. For example, a network equipment vendor may manufacture both Alternating Current (AC) power distribution modules and Direct Current (DC) power distribution modules whose appearances are similar to one another. The network equipment vendor may also manufacture both AC power supply modules and DC power supply modules whose appearances are similar to one another. In addition, the network equipment vendor may manufacture power distribution modules and/or power supply modules that have similar appearances to one another but very different electrical ratings from one another.

Unfortunately, the similarity in appearances may lead network administrators and/or technicians to mistake one for the other and/or improperly install one instead of the other, thereby potentially causing network devices to malfunction, disrupting network services, and/or effectuating costly damage. For example, the AC power distribution modules may be incompatible with the DC power supply modules, and the DC power distribution modules may be incompatible with the AC power supply modules. In other words, the installation of a DC power supply module into an AC power distribution module may cause damage to the DC power supply module, the AC power distribution module, and/or another network device component. Similarly, the installation of an AC power supply module into a DC power distribution module may cause damage to the AC power supply module, the DC power distribution module, and/or another network device component.

In addition, AC power supply modules and DC power supply modules may be incompatible with one another. In other words, the installation of both AC and DC power supply modules into the same power distribution module (whether AC or DC) may cause damage to the AC and/or DC power supply modules, the power distribution module, and/or another network device component. As another example, the installation of a 48-volt power supply module into a 240-volt power distribution module may cause damage to the 48-volt power supply module, the 240-volt power distribution module, and/or another network device component.

The instant disclosure, therefore, identifies and addresses a need for additional and improved apparatuses, systems, and methods for preventing improper installation of power supply modules on network devices.

SUMMARY

As will be described in greater detail below, the instant disclosure generally relates to apparatuses, systems, and methods for preventing improper installation of power supply modules on network devices. In one example, an apparatus for accomplishing such a task may include (1) at least one power distribution module that (A) distributes power to a network device that forwards traffic within a network and (B) includes a series of interlock blocks keyed to (I) enable power supply modules whose electrical ratings satisfy a certain threshold to be installed to the network device and (II) prevent other power supply modules whose electrical ratings do not satisfy the certain threshold from being installed to the network device and (2) at least one power supply module that (A) has an electrical rating that satisfies the certain threshold, (B) includes a flange that is keyed to fit between the interlock blocks of the power distribution module, and when installed to the network device by way of the power distribution module, (C) provides power to the network device that forwards traffic within the network.

Similarly, a network device incorporating the above-described apparatus may include (1) at least one power distribution module that (A) distributes power to the network device and (B) includes a series of interlock blocks keyed to (I) enable power supply modules whose electrical ratings satisfy a certain threshold to be installed to the network device and (II) prevent other power supply modules whose electrical ratings do not satisfy the certain threshold from being installed to the network device and (2) at least one power supply module that (A) has an electrical rating that satisfies the certain threshold, (B) includes a flange that is keyed to fit between the interlock blocks of the power distribution module, and when installed to the network device by way of the power distribution module, (C) provides power to the network device.

A corresponding method may include (1) disposing a series of interlock blocks across at least one power distribution module that distributes power to a network device that forwards traffic within a network, (2) keying the interlock blocks to (A) enable power supply modules whose electrical ratings satisfy a certain threshold to be installed to the network device and (B) prevent other power supply modules whose electrical ratings do not satisfy the certain threshold from being installed to the network device, and (3) creating, on a power supply module whose electrical rating satisfies the certain threshold, a flange keyed to fit between the interlock blocks of the power distribution module such that, when installed to the network device by way of the power distribution module, the power supply module is able to provide power to the network device that forwards traffic within the network.

Features from any of the above-mentioned embodiments may be used in combination with one another in accordance with the general principles described herein. These and other embodiments, features, and advantages will be more fully understood upon reading the following detailed description in conjunction with the accompanying drawings and claims.

BRIEF DESCRIPTION OF THE DRAWINGS

The accompanying drawings illustrate a number of exemplary embodiments and are a part of the specification. Together with the following description, these drawings demonstrate and explain various principles of the instant disclosure.

FIG. 6 is an illustration of an exemplary matrix of compatibility among different combinations of power distribution modules and power supply modules.

Figure 1:
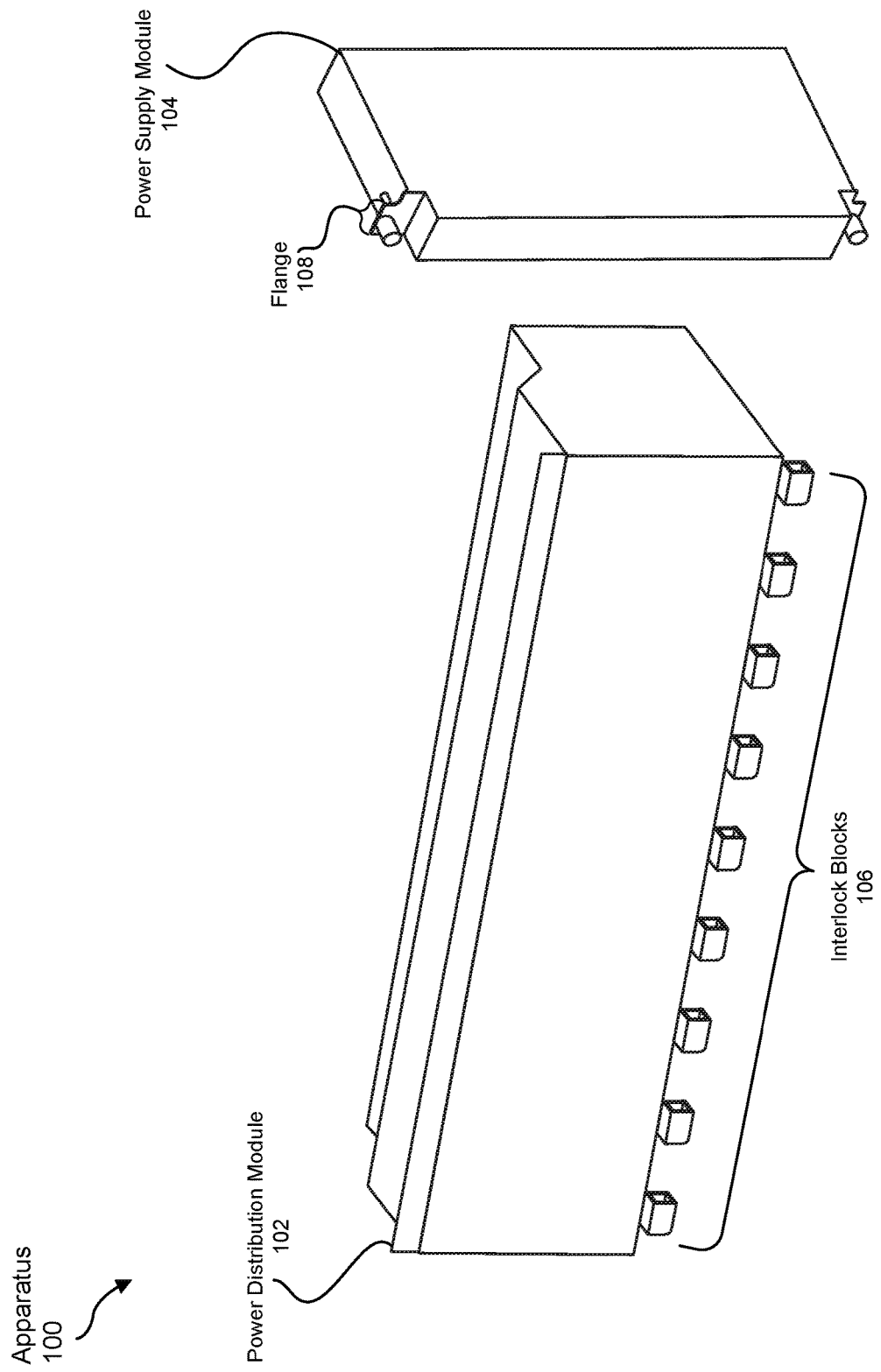
FIG. 1 is an illustration of an exemplary apparatus for preventing improper installation of power supply modules on network devices.

Throughout the drawings, identical reference characters and descriptions indicate similar, but not necessarily identical, elements. While the exemplary embodiments described herein are susceptible to various modifications and alternative forms, specific embodiments have been shown by way of example in the drawings and will be described in detail herein. However, the exemplary embodiments described herein are not intended to be limited to the particular forms disclosed. Rather, the instant disclosure covers all modifications, equivalents, and alternatives falling within the scope of the appended claims.

DETAILED DESCRIPTION OF EXEMPLARY EMBODIMENTS

The present disclosure describes various apparatuses, systems, and methods for preventing improper installation of power supply modules on network devices. As will be explained in greater detail below, embodiments of the instant disclosure may provide and/or implement various safety features on network devices. These safety features may effectively prevent improper installation of power supply modules on such network devices. For example, embodiments of the instant disclosure may provide and/or implement an interlocking and/or keying mechanism that prevents incompatible power supply modules from being installed to that particular power distribution module.

Additionally or alternatively, embodiments of the instant disclosure may provide and/or implement a mechanical assembly bar that includes a configurable keying mechanism on a network device. In one example, the configurable keying mechanism of the mechanical assembly bar may prevent incompatible power distribution modules from being installed to the network device.

By providing and/or implementing such safety features, these embodiments may prevent installation of incompatible power supply modules despite the similarity in the power supply modules' appearances. In doing so, these embodiments may also prevent certain device malfunctions, network service disruptions, and/or costly equipment damage that could potentially result from the installation of incompatible power supply modules.

The following discussion will provide, with reference to FIGS. 1-10, examples of apparatuses, systems, and implementations that prevent improper installation of power supply modules on network devices. In addition, the following discussion will provide, with reference to FIG. 11, examples of methods for preventing improper installation of power supply modules on network devices.

FIG. 1 shows an exemplary apparatus 100 that prevents improper installation of power supply modules on network devices. As illustrated in FIG. 1, apparatus 100 may include and/or represent at least one power distribution module 102 and at least one power supply module 104. The term "power distribution module" and the abbreviation "PDM," as used herein, generally refer to a field-replaceable hardware device that is designed for installation to a network device and distributes power to certain components of the network device via one or more power supply modules. The term "power supply module" and the abbreviation "PSM," as used herein, generally refer to a field-replaceable hardware device that is designed for installation to a network device and provides power from a power distribution module to certain components of the network device.

In some examples, power supply module 104 may include and/or represent a power-entry point that regulates electrical power fed and/or supplied to a network device. For example, power supply module 104 may regulate electrical power that passes through it on the way to certain power-consuming components of the network device. In one example, power supply module 104 may perform some sort of power conversion (such as DC-to-DC conversion and/or AC-to-DC conversion).

In some examples, power supply module 104 may represent an AC power supply module designed to support, handle, and/or accept AC power. In other examples, power supply module 104 may represent a DC power supply module designed to support, handle, and/or accept DC power. In some examples, power supply module 104 may have certain power, voltage, and/or electrical current ratings and/or limits. For example, power supply module 104 may have a voltage rating and/or limit of 48 Volts of DC (VDC), 240 VDC, or 380 VDC.

In one example, power supply module 104 may represent a universal and/or hybrid power supply module that supports, handles, and/or accepts both AC and DC power. For the purposes of the instant disclosure, such a universal and/or hybrid power supply may be considered and/or serve as the same type of power component as the corresponding power distribution module. In other words, in the event that power distribution module 102 represents an AC power distribution module, the universal and/or hybrid power supply may be considered and/or operate as an AC power supply module and not as a DC power supply module. However, in the event that power distribution module 102 represents an DC power distribution module, the universal and/or hybrid power supply may be considered and/or operate as an DC power supply module and not as a AC power supply module.

In some examples, power distribution module 102 may perform and/or manage power distribution operations on a network device to ensure that certain power-consuming components of the network device receive the power necessary to operate properly. In one example, power distribution module 102 may provide and/or serve as a power interface for power supply module 104 and/or additional power supply modules not illustrated in FIG. 1. Additionally or alternatively, power distribution module 102 may include and/or incorporate one or more power input connections to which certain AC and/or DC power sources are attached.

As a specific example, power distribution module 102 may include nine power input connections and up to nine corresponding power supply modules. In this example, up to nine AC power cords may be attached to those nine power input connections. Each AC power cord may carry single-phase or three-phase AC power from a power source to power distribution module 102. In turn, power distribution module 102 may distribute AC power to the nine or less power supply modules (including power supply module 104).

Continuing with this example, each AC power cord may operate independently of one another and feed power to a single power supply module. In one example, the nine or less power supply modules may regulate and/or convert the power before providing and/or delivering the same to one or more electrical components of a network device. Examples of such electrical components include, without limitation, Field-Replaceable Units (FRUs), linecards, control cards, fabric cards, fan trays, Physical Interface Cards (PICs), Flexible PIC Concentrators (FPCs), Switch Interface Boards (SIBs), routing engines, packet forwarding engines, switch fabric boards, modular interface cards, variations or combinations of one or more of the same, or any other suitable electrical components.

In some examples, power distribution module 102 may represent an AC power distribution module designed to support, handle, and/or accept AC power. In other examples, power distribution module 102 may represent a DC power distribution module designed to support, handle, and/or accept DC power. In some examples, power distribution module 102 may have certain power, voltage, and/or electrical current ratings and/or limits. For example, power distribution module 102 may have a voltage rating and/or limit of 48VDC, 240 VDC, or 380 VDC.

As illustrated in FIG. 1, power distribution module 102 may include a series of interlock blocks 106. In one example, interlock blocks 106 may span across a side, edge, and/or portion of power distribution module 106. In this example, interlock blocks 106 may be keyed to enable power supply modules whose electrical ratings satisfy a certain threshold to be installed to the network device. Accordingly, interlock blocks 106 may also prevent other power supply modules whose electrical ratings do not satisfy the certain threshold from being installed to the network device.

The term "electrical rating," as used herein, generally refers to any rating of and/or limit on the amount of electricity that a device and/or component is able to support, handle, and/or accept. Examples of such an electrical rating includes, without limitation, electric power ratings and/or limits, voltage ratings and/or limits, electric current ratings and/or limits, electric charge ratings and/or limits, variations or combinations of one or more of the same, and/or any other suitable electrical rating.

In some examples, the threshold may represent, match, and/or correspond to an electrical rating of power distribution module 102. For example, power distribution module 102 may have a voltage rating of 380 volts. In this example, the threshold may represent and/or correspond to 380 volts. Accordingly, to satisfy this threshold, compatible power supply modules may need to have at least a 380-volt rating. In other words, all power supply modules whose voltage ratings are below 380 volts may be incompatible with power distribution module 102.

As a specific example, in the event that power distribution module 102 is rated to support 380 VDC, interlock blocks 106 may be keyed to enable 380-volt power supply modules to be installed to the network device by way of power distribution module 102. In this example, interlock blocks 106 may also be keyed to prevent 240-volt power supply modules and 48-volt power supplies from being installed to the network device by way of power distribution module 102.

As another example, in the event that power distribution module 102 is rated to support 240 VDC, interlock blocks 106 may be keyed to enable 240-volt power supply modules to be installed to the network device by way of power distribution module 102. In this example, interlock blocks 106 may also be keyed to prevent 380-volt power supply modules and 48-volt power supplies from being installed to the network device by way of power distribution module 102. Alternatively, in the event that 380-volt power supply modules are still compatible with power distribution module 102 despite the voltage rating discrepancy, interlock blocks 106 may be keyed to enable 380-volt power supply modules to be installed to the network device by way of power distribution module 102. In other words, the voltage rating of power supply modules may, in some cases, satisfy the threshold even if that voltage is greater than the voltage rating of the corresponding power supply module.

Interlock blocks 106 may be of various shapes and/or dimensions. In some examples, each of interlock blocks 106 may form a square, a circle, a rectangle, and/or a cube. Additional examples of shapes formed by interlock blocks 106 include, without limitation, triangles, pentagons, hexagons, octagons, ovals, diamonds, parallelograms, variations or combinations of one or more of the same, portions of one or more of the same, and/or any other suitable shapes.

In some examples, interlock blocks 106 may be sized in a particular way to form the keying feature of power distribution module 102. For example, interlock blocks 106 may be sized to form a series of gaps in-between each block. In this example, the gaps formed between interlock blocks 106 may be sized to accept compatible power supply modules and reject incompatible power supply modules. More specifically, the gaps formed between interlock blocks 106 may be sized to fit the flanges of compatible power supply modules but not fit the flanges of incompatible power supply modules.

Interlock blocks 106 may each include and/or contain any of a variety of materials. Examples of such materials include, without limitation, metals, plastics, ceramics, polymers, composites, variations or combinations of one or more of the same, and/or any other suitable materials.

The term "interlock," as used herein, generally refers to a safety feature that involves a joining and/or connection point for multiple components of a network device. For example, interlock blocks 106 of power distribution module 102 may form and/or represent one side of a safety feature, and flange 108 of power supply 104 may form and/or represent the other side of the safety feature. In this example, interlock blocks 106 may ensure that only compatible power supply modules are able to be installed to the network device via power distribution module 102.

In the event that power supply module 104 is compatible with power distribution module 102, flange 108 may be sized to fit between and/or within interlock blocks 106. However, in the event that power supply module 104 is incompatible with power distribution module 102, flange 108 may be too large to fit between and/or within interlock blocks 106. Accordingly, the combination of interlock blocks 106 and flange 108 may serve to protect the integrity and/or functionality of power supply module 104, power distribution module 102, and/or other components of the network device against temporary disruption and/or permanent damage.

Flange 108 may be of various shapes and/or dimensions. In some examples, each of interlock blocks 106 may form a square, a circle, a rectangle, and/or a cube. Additional examples of shapes formed by flange 108 include, without limitation, triangles, pentagons, hexagons, octagons, ovals, diamonds, parallelograms, variations or combinations of one or more of the same, portions of one or more of the same, and/or any other suitable shapes.

In some examples, flange 108 may be sized in a particular way to form a keying feature of power supply module 104. For example, flange 108 may be sized to fit between interlock blocks 106. In this example, flange 108 may be keyed to interlock blocks 106 in the event that power supply module 104 is compatible with power distribution module 102. However, in the event that power supply module 104 is incompatible with power distribution module 102, flange 108 may be keyed to the interlock blocks of one or more different types of power distribution module. In such an example, interlock blocks 106 may reject flange 108 and/or prevent flange 108 from being installed to the network device via power distribution module 102.

Flange 108 may each include and/or contain any of a variety of materials. Examples of such materials include, without limitation, metals, plastics, ceramics, polymers, composites, variations or combinations of one or more of the same, and/or any other suitable materials.

Figure 2:
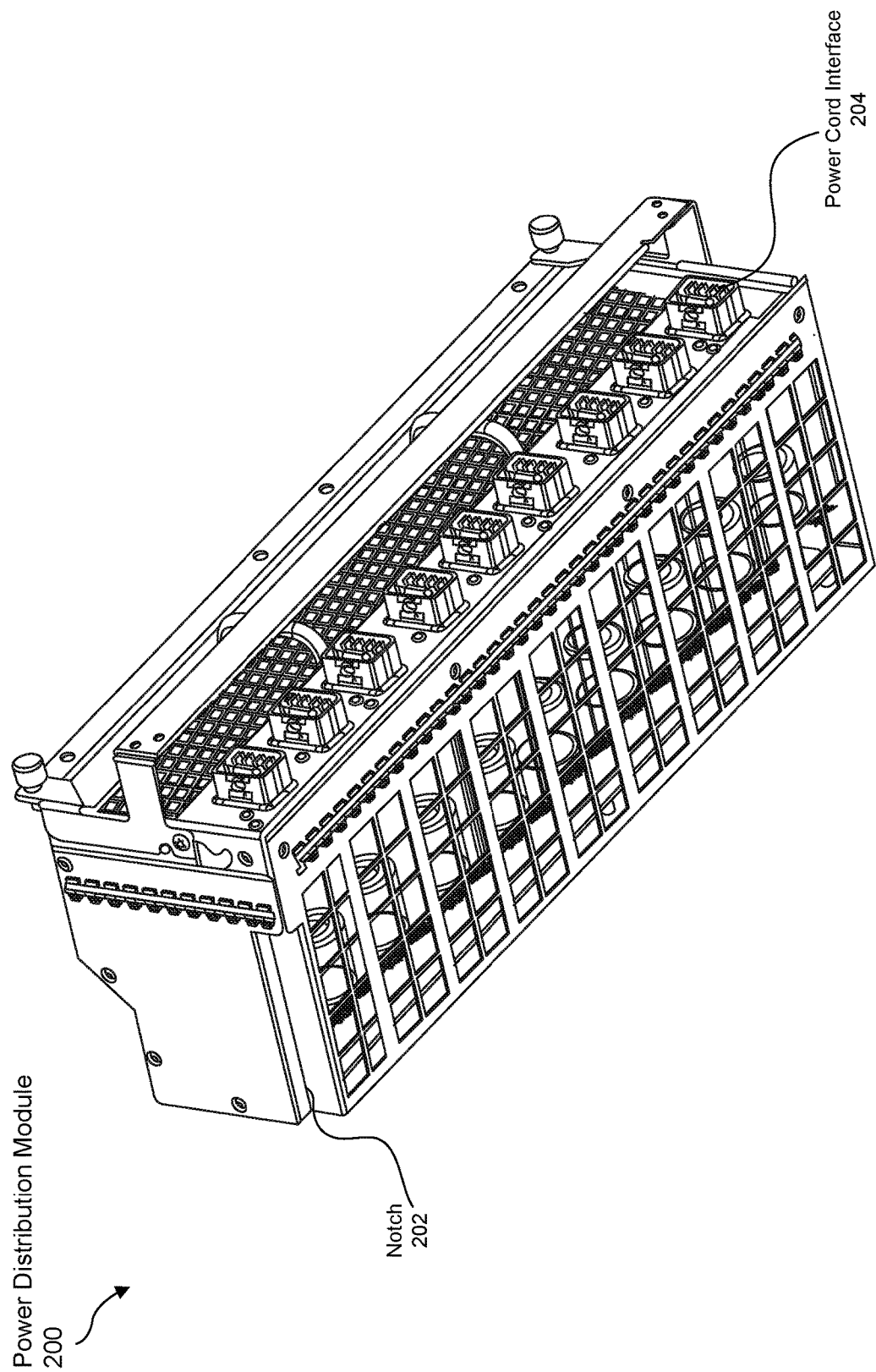
FIG. 2 is an illustration of an exemplary power distribution module.

FIG. 2 shows an exemplary power distribution module 200. As illustrated in FIG. 2, power distribution module 200 may include and/or have a notch 202 and at least one power cord interface 204. In one example, notch 202 may represent a safety feature that is keyed to facilitate installation to a network device with a particular configuration. For example, notch 202 may correspond to a DC power distribution module, thereby indicating that power distribution module 200 supports, handles, and/or accepts DC power. In contrast, if the notch were located on the opposite side of power distribution module 200 (although not illustrated in this way in FIG. 2), such a notch may correspond to an AC power distribution module, thereby indicating that power distribution module 200 supports, handles, and/or accepts AC power.

As illustrated in FIG. 2, power distribution module 200 may include and/or incorporate at least one power cord interface 204. In this example, a compatible AC and/or DC power source may be attached and/or connected to power distribution module 102 via power cord interface 204. Power cord interface 204 may be of any suitable size and/or type to facilitate a connection between power distribution module 200 and the compatible AC and/or DC power source.

Figure 3:
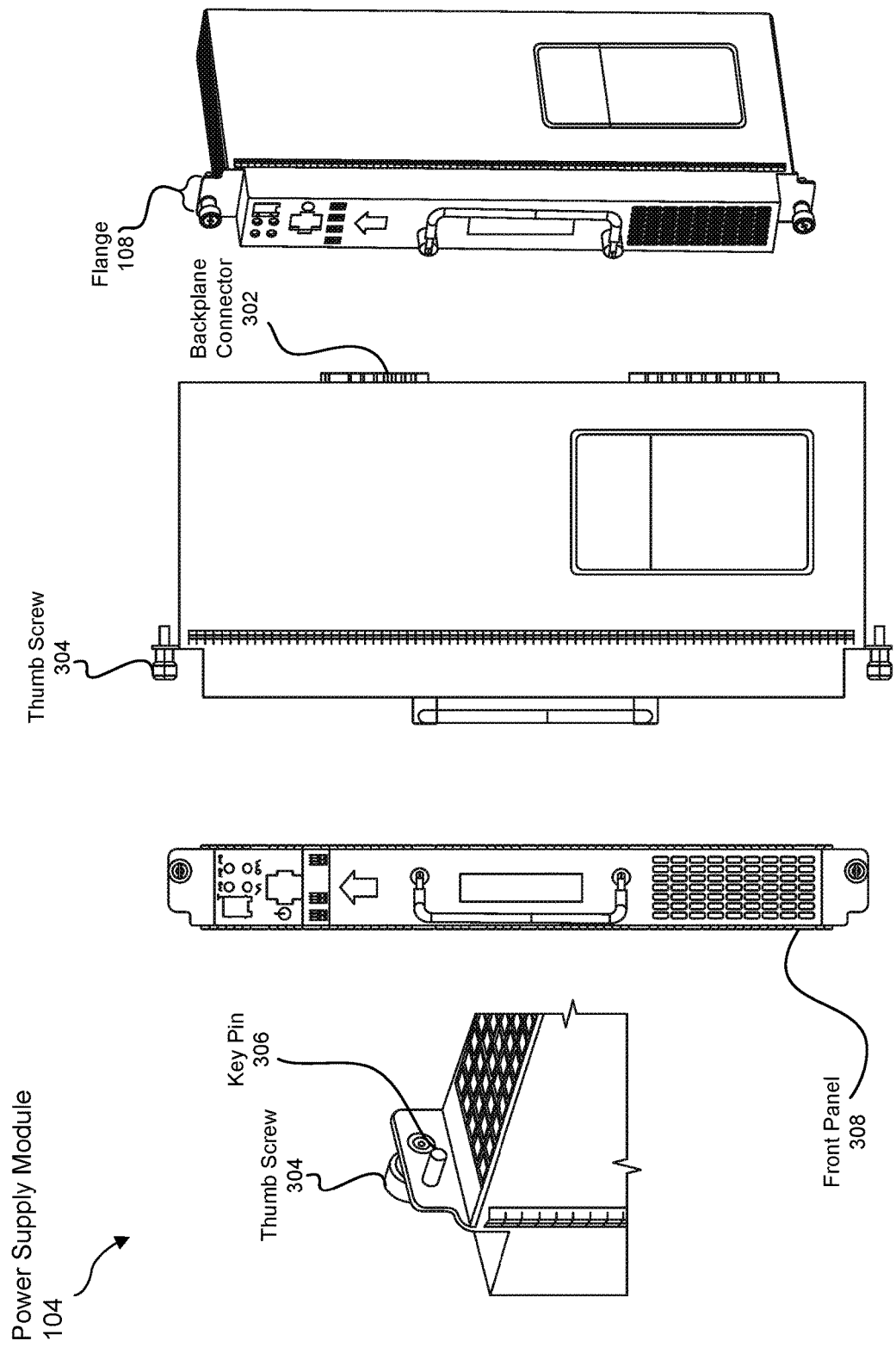
FIG. 3 is an illustration of an exemplary power supply module.

FIG. 3 shows several different views of an exemplary power supply module 104. As illustrated in FIG. 3, power supply module 104 may include and/or incorporate a front panel 308 that is exposed and/or accessible after installation. Power supply module 104 may also include and/or incorporate a backplane connector 302 that interfaces with a backplane of a network device. In one example, backplane connector 302 may electrically couple to the backplane of the network device when power supply module 104 is properly installed in the network device. Power supply module 104 may also include and/or incorporate a thumb screw 304 that secures flange 108 to power distribution module 108. When tightened upon installation, thumb screw 304 may hold power supply module 104 in place with respect to the network device, thereby ensuring that power supply module 104 does not dislodge from the network device and/or backplane connector 302 does not electrically decouple and/or demate from the network device's backplane.

As illustrated in FIG. 3, power supply module 104 may further include and/or incorporate a key pin 306. In some examples, key pin 306 may be keyed to enable power supply module 104 to be installed into a compatible power distribution module that is configured to accept power supply modules of the same type as power supply module 104. For example, key pin 306 may be accepted by a receptacle of a mechanical assembly bar (such as mechanical assembly bars 502(1) and 502(2) in FIG. 5) that is physically coupled to the network device provided that the mechanical assembly bar is configured to accept power supply module 104. In contrast, key pin 306 may be rejected by a receptacle of the mechanical assembly bar in the event that power supply module 104 is incompatible with power distribution module 102 or power distribution module 102 is improperly configured to accept power supply module 104.

Key pin 306 may be of various shapes and/or dimensions. In some examples, each of interlock key pin 306 may form a square, a circle, a rectangle, and/or a cube. Additional examples of shapes formed by key pin 306 include, without limitation, cylinders, triangles, pentagons, hexagons, octagons, ovals, diamonds, parallelograms, variations or combinations of one or more of the same, portions of one or more of the same, and/or any other suitable shapes.

In some examples, key pin 306 may be sized in a particular way to form a keying feature of power supply module 104. For example, key pin 306 may be sized to fit inside a receptacle of a properly configured, compatible mechanical assembly bar that is physically coupled to the network device. In this example, key pin 306 may be keyed to the receptacle so long as power supply module 104 is compatible with power distribution module 102 and the mechanical assembly bar is configured to accept power supply modules of the same type as power supply module 104.

In some examples, to be compatible with one another, power supply module 104 and power distribution module 102 may need to support the same type of power. For example, power supply module 104 and power distribution module 102 may be compatible with one another so long as they both support AC power. In other example, power supply module 104 and power distribution module 102 may be compatible with one another so long as they both support DC power. Accordingly, in the event that power supply module 104 and power distribution module 102 do not support the same type of power, power supply module 104 and power distribution module 102 may be incompatible with one another. In addition to the power type, other conditions (such as electrical rating) may also need to be satisfied for power supply module 104 and power distribution module 102 to be incompatible with one another.

Key pin 306 may each include and/or contain any of a variety of materials. Examples of such materials include, without limitation, metals, plastics, ceramics, polymers, composites, variations or combinations of one or more of the same, and/or any other suitable materials.

Figure 4:
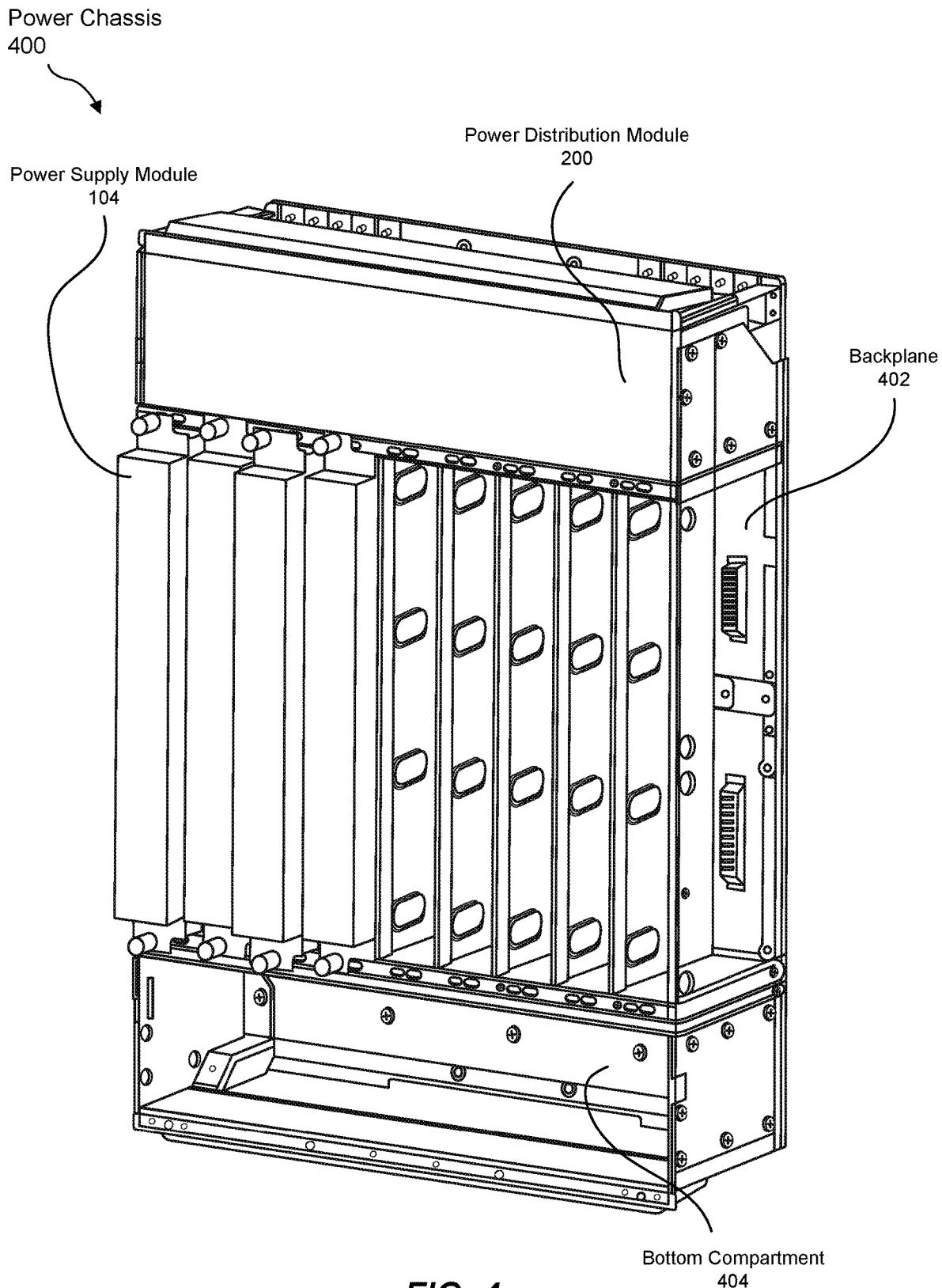
FIG. 4 is an illustration of an exemplary power chassis of a network device.

FIG. 4 shows an exemplary power chassis 400 of a network device. As illustrated in FIG. 4, power chassis 400 may include and/or incorporate compartments and/or slots for housing and/or installing power distribution modules. For example, power distribution module 200 may be installed to a top compartment (not explicitly labelled in FIG. 4) within power chassis 400. In this example, another power distribution module (not illustrated in FIG. 4) may be installed to bottom compartment 404 within power chassis 400. In the event that power distribution modules are installed in both the top compartment and bottom compartment 404 of power chassis 400, these power distribution modules may be redundant with one another and/or provide or facilitate power redundancy for the network device.

As illustrated in FIG. 4, power chassis 400 may also include and/or incorporate compartments and/or slots for housing and/or installing power supply modules (such as power supply module 104). In the event that multiple power supply modules are installed in power chassis 400 by way of power distribution module 102, these power supply modules may be redundant with one another and/or provide or facilitate power redundancy for the network device.

Continuing with this example, power chassis 400 may further include and/or incorporate a backplane 402 to which the power supply modules installed to the network device are electrically connected and/or coupled. Power chassis 400 may provide, feed, and/or deliver electrical power to other components of the network device to enable the network device to forward traffic within a network and/or across networks. For example, the network device may forward traffic to one or more other computing devices (not illustrated in FIGS. 1-11). In this example, the computing devices to which the traffic is forwarded may represent next hops and/or intermediary hops along the path toward the traffic's final destination. Alternatively, these computing devices may represent the traffic's final destination.

Figure 5:
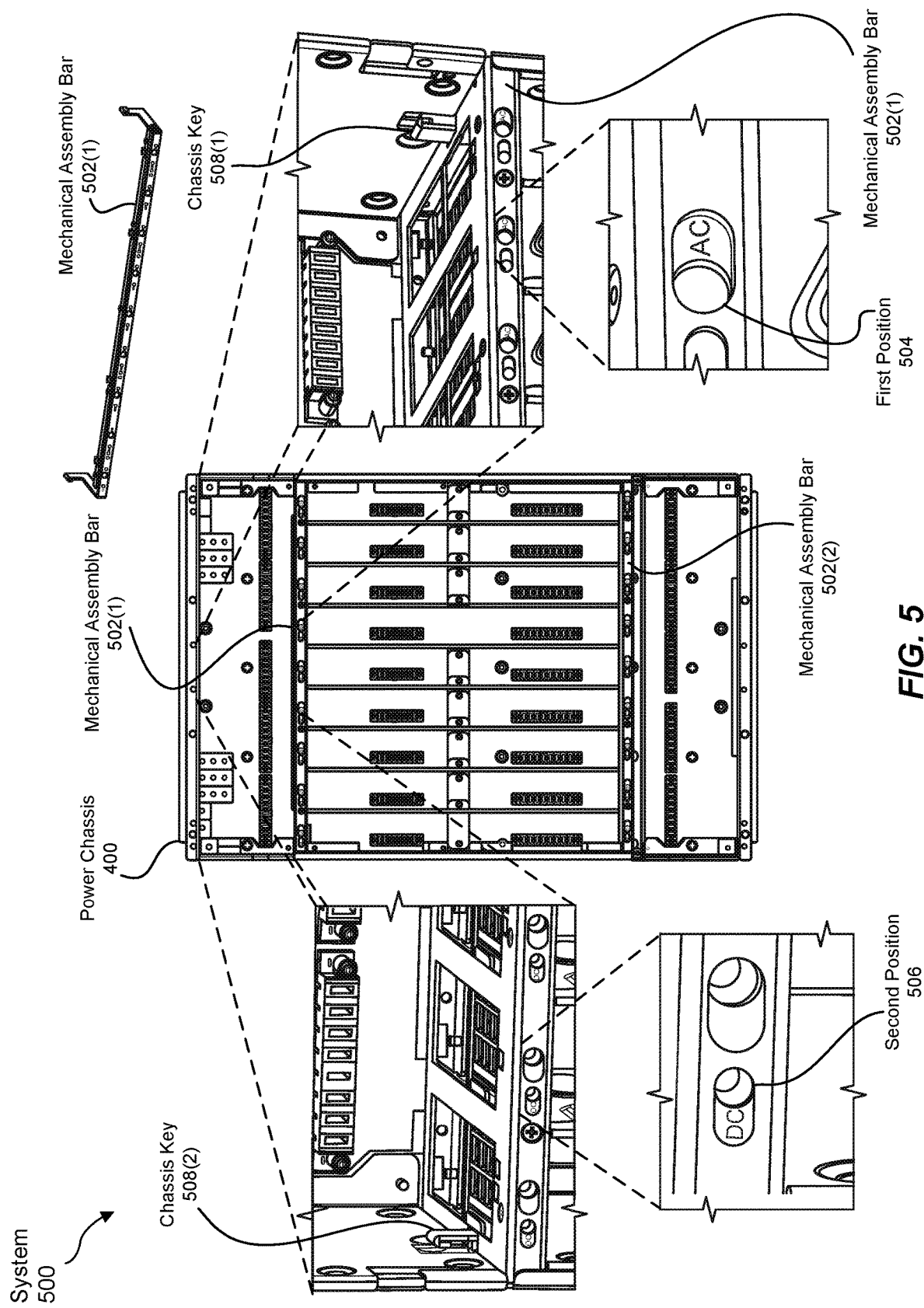
FIG. 5 is an illustration of an exemplary system for preventing improper installation of power supply modules on network devices.

FIG. 5 shows several different views of an exemplary system 500 for preventing improper installation of power supply modules on network devices. As illustrated in FIG. 5, system 500 may include and/or represent power chassis 400 and one or more mechanical assembly bars (such as mechanical assembly bars 502(1) and 502(2)). In one example, mechanical assembly bars 502(1) and 502(2) may be physically coupled to a network device by way of power chassis 400. In this example, mechanical assembly bars 502(1) and 502(2) may each include and/or incorporate a configurable keying mechanism that effectively configures and/or enables the network device for operation with either AC power components or DC power components.

As a specific example, the configurable keying mechanism of mechanical assembly bars 502(1) may be set and/or moved to a first position 504. For example, a network administrator and/or technician may set and/or move a member or handle of the configurable keying mechanism to first position 504, thereby configuring mechanical assembly bar 502(1). As illustrated in FIG. 5, first position 504 may correspond to and/or represent an AC power configuration in which only AC power distribution modules and/or AC power supply modules are able to fit in and/or be installed to the network device.

Continuing with this example, chassis key 508(1) may be mechanically engaged and/or applied when mechanical assembly bar 502(1) is set to first position 504. In addition, when mechanical assembly bar 502(1) is set to first position 504, chassis key 508(2) may be mechanically disengaged and/or removed. In this example, when engaged and/or applied, chassis key 508(1) may enable AC power supply distribution modules that include a corresponding notch on that side to be installed to the top compartment of power chassis 400. However, when engaged and/or applied, chassis key 508(1) may also prevent DC power supply distribution modules that include a notch on the opposite side from being installed to the top compartment of power chassis 400.

As another example, the configurable keying mechanism of mechanical assembly bars 502(1) may be set and/or moved to a second position 506. For example, a network administrator and/or technician may set and/or move a member or handle of the configurable keying mechanism to second position 506, thereby configuring mechanical assembly bar 502(1). As illustrated in FIG. 5, second position 506 may correspond to and/or represent a DC power configuration in which only DC power distribution modules and/or DC power supply modules are able to fit in and/or be installed to the network device.

Similarly, chassis key 508(2) may be mechanically engaged and/or applied when mechanical assembly bar 502(1) is set to second position 506. In addition, when mechanical assembly bar 502(1) is set to second position 506, chassis key 508(1) may be mechanically disengaged and/or removed. In this example, when engaged and/or applied, chassis key 508(2) may enable DC power supply distribution modules that include a corresponding notch on that side to be installed to the top compartment of power chassis 400. However, when engaged and/or applied, chassis key 508(2) may also prevent AC power supply distribution modules that include a notch on the opposite side from being installed to the top compartment of power chassis 400.

In some examples, power distribution module 102 may be backward compatible with earlier and/or existing versions of power supply modules and power chassis. Similarly, power supply module 104 may be backward compatible with earlier and/or existing versions of power distribution modules and power chassis. Accordingly, despite the new interlocking, safety, and/or keying features described in the instant disclosure, power distribution module 102 may still be properly installed to an older power chassis and/or function properly with older power supply modules. Similarly, despite the new interlocking, safety, and/or keying features described in the instant disclosure, power supply module 104 may still be properly installed to an older power distribution module.

FIG. 6 shows an exemplary compatibility matrix 600. As illustrated in FIG. 6, compatibility matrix 600 may identify and/or indicate certain combinations of power distribution modules and power supply modules that are compatible and/or incompatible with one another. In one example, compatibility matrix 600 may represent the compatibility of such power distribution modules and power supply modules in connection with a specific product line of network devices.

As illustrated in FIG. 6, compatibility matrix 600 may indicate that a new 240 VDC PSM is compatible with a new 240 VDC PDM but incompatible with an existing AC PDM, an existing 48 VDC PDM, and a new 380 VDC PDM. In this example, compatibility matrix 600 may also indicate that an existing DC PSM is compatible with an existing 48 VDC PDM but incompatible with an existing AC PDM, a new 240 VDC PDM, and a new 380 VDC PDM. In addition, compatibility matrix 600 may indicate that an existing AC PSM is compatible with the existing AC PDM but incompatible with the existing 48 VDC PDM, the new 240 VDC PDM, and the new 380 VDC PDM. Compatibility matrix 600 may further indicate that a new universal DC/AC PSM is compatible with the existing AC PDM, the new 240 VDC PDM, and the new 380 VDC PDM but incompatible with the existing 48 VDC PDM.

Figure 7:
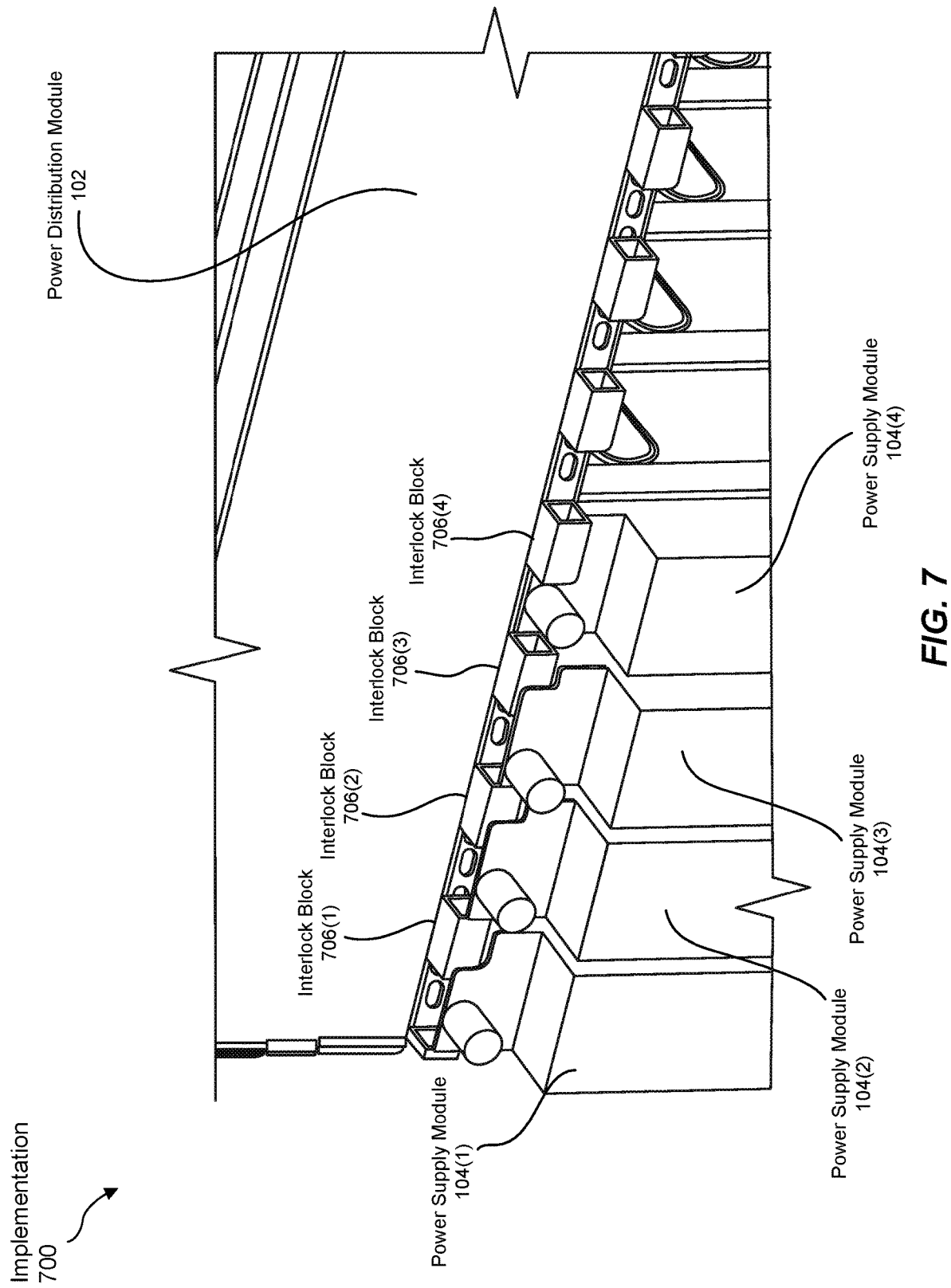
FIG. 7 is an illustration of an exemplary implementation for preventing improper installation of power supply modules on network devices.

As will be explained in greater detail below, FIGS. 7-10 show exemplary implementations of apparatus 100 in connection with the different combinations of power distribution modules and power supply modules from compatibility matrix 600 in FIG. 6. In particular, FIG. 7 shows an exemplary implementation 700 of apparatus 100. As illustrated in FIG. 7, implementation 700 may include and/or involve power distribution module 102 and power supply modules 104(1), 104(2), 104(3), and 104(4). In this example, power distribution module 102 may include and/or incorporate interlock blocks 706(1), 706(2), 706(3), and 706(4) among others.

As a specific example in connection with FIG. 7, power distribution module 102 may represent a new 380 VDC PDM, power supply module 104(1) may represent a new 240 VDC PSM, power supply module 104(2) may represent an existing 48 VDC PSM, power supply module 104(3) may represent an existing AC PSM, and power supply module 104(4) may represent a new hybrid DC/AC PSM. As illustrated in FIG. 7, interlock blocks 706(1)-(3) may impede and/or prevent power supply modules 104(1)-(3) from being installed to power distribution module 102 because power supply modules 104(1)-(3) are incompatible with power distribution module 102. In contrast, interlock blocks 706(3) and 706(4) may fail to impede and/or prevent power supply module 104(4) from being installed to power distribution module 102 because power supply module 104(4) and power distribution module 102 are compatible with one another. As a result, power supply module 104(4) may be properly installed to power distribution module 102 and provide power to other components of the corresponding network device to facilitate forwarding traffic.

Figure 8:
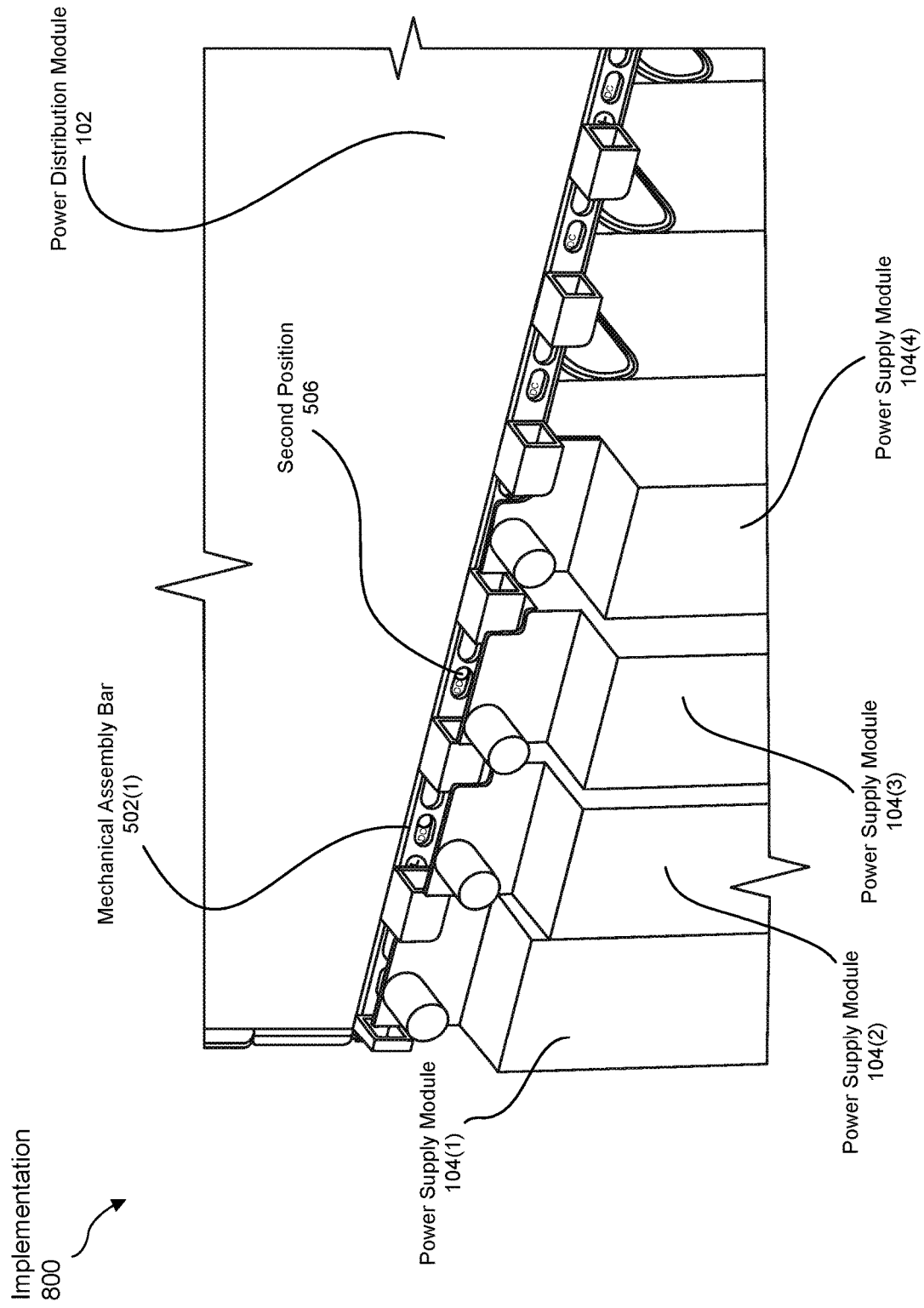
FIG. 8 is an illustration of an exemplary implementation for preventing improper installation of power supply modules on network devices.

FIG. 8 shows an exemplary implementation 800 of apparatus 100. As illustrated in FIG. 8, implementation 800 may include and/or involve power distribution module 102, power supply modules 104(1)-(4), and mechanical assembly bar 502(1). In this example, power distribution module 102 may include and/or incorporate the same interlock blocks shown in implementation 700 in FIG. 7. In addition, the keying mechanism of mechanical assembly bar 502 may be set to second position 506 for DC power components.

As a specific example in connection with FIG. 8, power distribution module 102 may represent a new 240 VDC PDM, power supply module 104(1) may represent a new 240 VDC PSM, power supply module 104(2) may represent an existing 48 VDC PSM, power supply module 104(3) may represent an existing AC PSM, and power supply module 104(4) may represent a new hybrid DC/AC PSM. As illustrated in FIG. 8, the interlock blocks may impede and/or prevent power supply modules 104(2) and 104(3) from being installed to power distribution module 102 because power supply modules 104(2) and 104(3) are incompatible with power distribution module 102. In contrast, the interlock blocks may fail to impede and/or prevent power supply modules 104(1) and 104(4) from being installed to power distribution module 102 because power supply modules 104(1) and 104(4) and power distribution module 102 are compatible with one another. As a result, power supply modules 104(1) and 104(4) may be properly installed to power distribution module 102 and provide power to other components of the corresponding network device to facilitate forwarding traffic.

Figure 9:
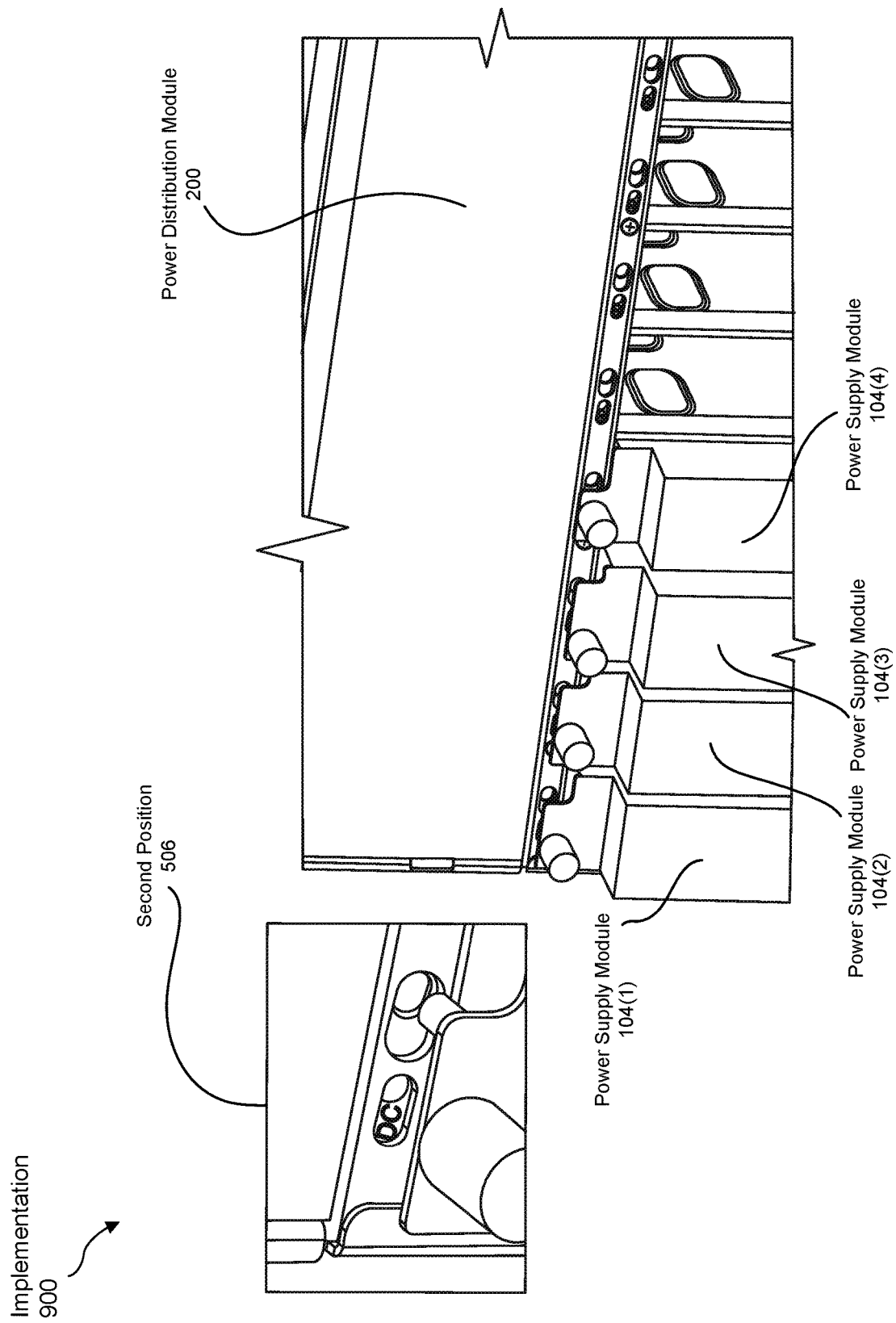
FIG. 9 is an illustration of an exemplary implementation for preventing improper installation of power supply modules on network devices.

FIG. 9 shows an exemplary implementation 900 of apparatus 100. As illustrated in FIG. 9, implementation 900 may include and/or involve power distribution module 200, power supply modules 104(1)-(4), and a mechanical assembly bar. In this example, power distribution module 200 may fail to include and/or incorporate any interlock blocks. The keying mechanism of the mechanical assembly bar may be set to second position 506 for DC power components.

As a specific example in connection with FIG. 9, power distribution module 200 may represent an existing 48 VDC PDM, power supply module 104(1) may represent a new 240 VDC PSM, power supply module 104(2) may represent an existing 48 VDC PSM, power supply module 104(3) may represent an existing AC PSM, and power supply module 104(4) may represent a new hybrid 380 VDC/AC PSM. As illustrated in FIG. 9, because power distribution module 200 does not include any interlock blocks, power supply modules 104(1), 104(2), and 104(4) may freely be installed to power distribution module 200.

However, despite being installed to power distribution module 200, power supply modules 104(1) and 104(4) may fail to power up and/or operate due at least in part to power distribution module 200 having a 48 VDC rating and power supply modules 104(1) and 104(4) having a 240 VDC rating and a 380 VDC rating, respectively. In contrast, power supply module 104(2) may power up and/or operate as expected due at least in part to power distribution module 200 and power supply module 102(2) both having a 48 VDC rating.

As illustrated in FIG. 9, even though power distribution module 200 does not include any interlock blocks, power supply module 104(3) may still be blocked from installation to power distribution module 200. For example, power supply module 104(3) may include a key pin that fits in the corresponding receptacle of the mechanical assembly bar only when the keying mechanism is set to first position 504. In this example, the receptacle may change locations as the keying mechanism is moved from first position 504 to second position 506. As a result, when the keying mechanism is set to second position 506 for DC power components, the receptacle may be misaligned with respect to the key pin on AC power supply modules. Accordingly, because the keying mechanism is set to second position 506 in FIG. 9, the mechanical assembly bar may reject the key pin on power supply module 104(3), thereby preventing proper installation of power supply module 104(3).

Figure 10:
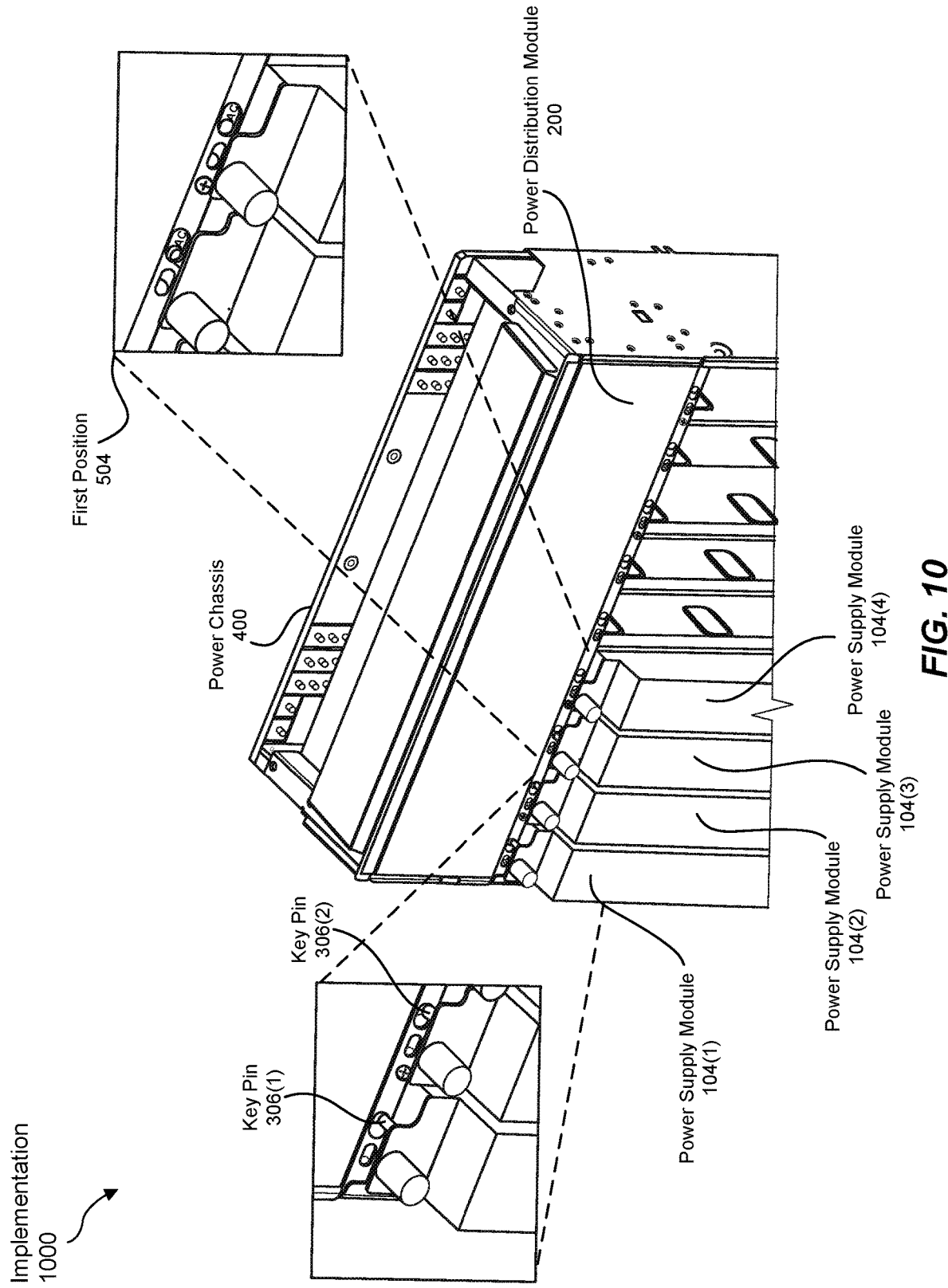
FIG. 10 is an illustration of an exemplary implementation for preventing improper installation of power supply modules on network devices.

FIG. 10 shows an exemplary implementation 1000 of apparatus 100. As illustrated in FIG. 10, implementation 1000 may include and/or involve power distribution module 200 installed in power chassis 400, power supply modules 104(1)-(4), and a mechanical assembly bar. In this example, power distribution module 200 may fail to include and/or incorporate any interlock blocks. The keying mechanism of the mechanical assembly bar may be set to first position 504 for AC power components.

As a specific example in connection with FIG. 10, power distribution module 200 may represent an existing AC PDM, power supply module 104(1) may represent a new 240 VDC PSM, power supply module 104(2) may represent an existing 48 VDC PSM, power supply module 104(3) may represent an existing AC PSM, and power supply module 104(4) may represent a new hybrid VDC/AC PSM. As illustrated in FIG. 10, because power distribution module 200 does not include any interlock blocks, power supply modules 104(3) and 104(4) may freely be installed to power distribution module 200. In addition, power supply modules 104(3) and 104(4) may power up and/or operate as expected.

As illustrated in FIG. 10, even though power distribution module 200 does not include any interlock blocks, power supply modules 104(1) and 104(2) may still be blocked from installation to power distribution module 200. For example, power supply modules 104(1) and 104(2) may include key pins 306(1) and 306(2), respectively, that fit in the corresponding receptacles of the mechanical assembly bar only when the keying mechanism is set to second position 506. In this example, the receptacle may change locations as the keying mechanism is moved from second position 506 to first position 504. As a result, when the keying mechanism is set to first position 504 for AC power components, the receptacle may be misaligned with respect to the key pin on DC power supply modules. Accordingly, because the keying mechanism is set to first position 504 in FIG. 10, the mechanical assembly bar may reject key pins 306(1) and 306(2) on power supply modules 104(1) and 104(2), respectively, thereby preventing proper installation of power supply modules 104(1) and 104(2).

Figure 11:
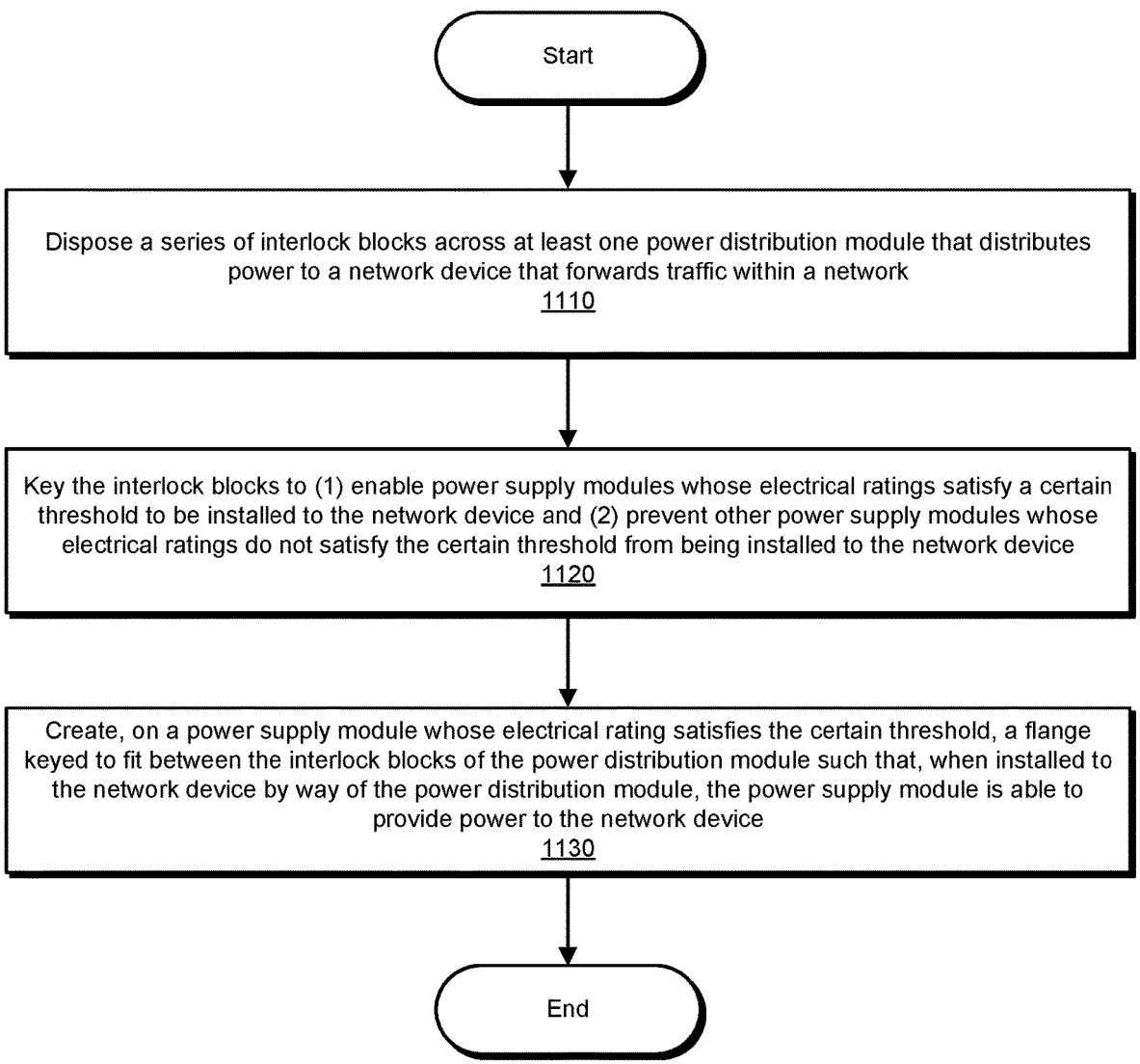
FIG. 11 is a flow diagram of an exemplary method for preventing improper installation of power supply modules on network devices.

FIG. 11 is a flow diagram of an exemplary method 1100 for preventing improper installation of power supply modules on network devices. Method 1100 may include the step of disposing a series of interlock blocks across at least one power distribution module that distributes power to a network device that forwards traffic within a network (1110). This disposing step may be performed in a variety of ways. For example, a network equipment manufacturer may design a power distribution module that includes and/or calls for a set of interlock blocks that span the length of one side and/or edge. In this example, the network equipment manufacturer may machine and/or assemble the power distribution module such that it includes the set of interlock blocks along the side and/or edge.

Returning to FIG. 11, method 1100 may also include the step of keying the interlock blocks to (1) enable power supply modules whose electrical ratings satisfy a certain threshold to be installed and (2) prevent power supply modules whose electrical ratings do not satisfy the certain threshold from being installed to the network device (1120). This keying step may be performed in a variety of ways. For example, a network equipment manufacturer may design the set of interlock blocks such that they form gaps along the side or edge. In this example, the network equipment manufacturer may size and/or space the interlock blocks and corresponding gaps such that the flanges of power supply modules that have certain electrical ratings fit between the interlock blocks and/or within the corresponding gaps.

For example, the network equipment manufacturer may size and/or space the interlock blocks of a 380-volt PDM such that the flanges of 380-volt PSMs fit between the interlock blocks and/or within the corresponding gaps. In this example, the network equipment manufacturer may also size and/or space the interlock blocks of the 380-volt PDM such that the flanges of 240-volt and 48-volt PSMs are unable to fit between the interlock blocks and/or within the corresponding gaps for installation.

As another example, the network equipment manufacturer may size and/or space the interlock blocks of a 240-volt PDM such that the flanges of 240-volt PSMs fit between the interlock blocks and/or within the corresponding gaps. In this example, the network equipment manufacturer may also size and/or space the interlock blocks of the 240-volt PDM such that the flanges of 380-volt and 48-volt PSMs are unable to fit between the interlock blocks and/or within the corresponding gaps for installation. Alternatively, the network equipment manufacturer may size and/or space the interlock blocks of the 240-volt PDM such that the flanges of 380-volt PSMs do fit for installation but those of 48-volt PSMs do not fit for installation.

Returning to FIG. 11, method 1100 may also include the step of creating, on a power supply module whose electrical rating satisfies the certain threshold, a flange keyed to fit between the interlock blocks of the power distribution module such that, when installed to the network device by way of the power distribution module, the power supply module is able to provide power to the network device that forwards traffic within the network (1130). This creating step may be performed in a variety of ways. For example, a network equipment manufacturer may design and/or manufacture the flange of a power supply module to fit between the interlock blocks of the power distribution module. In this example, the power supply module may have a voltage rating that matches and/or is compatible with the voltage rating of the power distribution module.

By designing and/or manufacturing the flange of the power supply module in this way, the network equipment manufacturer may effectively key the power supply module and the power distribution module for use with one another due at least in part to their compatible voltage ratings. In addition, since the flange of the power supply module is keyed to the interlock blocks of the power distribution module, the flange of the power supply module may be sized and/or shaped to be rejected by the interlock blocks of incompatible power distribution modules.

While the foregoing disclosure sets forth various embodiments using specific block diagrams, flowcharts, and examples, each block diagram component, flowchart step, operation, and/or component described and/or illustrated herein may be implemented, individually and/or collectively, using a wide range of hardware, software, or firmware (or any combination thereof) configurations. In addition, any disclosure of components contained within other components should be considered exemplary in nature since many other architectures can be implemented to achieve the same functionality.

In some examples, all or a portion of system 100 in FIG. 1 may represent portions of a cloud-computing or network-based environment. Cloud-computing and network-based environments may provide various services and applications via the Internet. These cloud-computing and network-based services (e.g., software as a service, platform as a service, infrastructure as a service, etc.) may be accessible through a web browser or other remote interface. Various functions described herein may also provide network switching capabilities, gateway access capabilities, network security functions, content caching and delivery services for a network, network control services, and/or and other networking functionality.

The process parameters and sequence of the steps described and/or illustrated herein are given by way of example only and can be varied as desired. For example, while the steps illustrated and/or described herein may be shown or discussed in a particular order, these steps do not necessarily need to be performed in the order illustrated or discussed. The various exemplary methods described and/or illustrated herein may also omit one or more of the steps described or illustrated herein or include additional steps in addition to those disclosed.

The preceding description has been provided to enable others skilled in the art to best utilize various aspects of the exemplary embodiments disclosed herein. This exemplary description is not intended to be exhaustive or to be limited to any precise form disclosed. Many modifications and variations are possible without departing from the spirit and scope of the instant disclosure. The embodiments disclosed herein should be considered in all respects illustrative and not restrictive. Reference should be made to the appended claims and their equivalents in determining the scope of the instant disclosure.

Unless otherwise noted, the terms "connected to" and "coupled to" (and their derivatives), as used in the specification and claims, are to be construed as permitting both direct and indirect (i.e., via other elements or components) connection. In addition, the terms "a" or "an," as used in the specification and claims, are to be construed as meaning "at least one of." Finally, for ease of use, the terms "including" and "having" (and their derivatives), as used in the specification and claims, are interchangeable with and have the same meaning as the word "comprising."

What is claimed is:

1. An apparatus comprising:
at least one power distribution module that:
distributes power to a network device that forwards traffic within a network; and
includes a series of interlock blocks keyed to:
enable power supply modules whose electrical ratings satisfy a certain threshold to be installed to the network device; and
prevent other power supply modules whose electrical ratings do not satisfy the certain threshold from being installed to the network device; and
at least one power supply module that:
has an electrical rating that satisfies the certain threshold;
includes a flange that is keyed to fit between the interlock blocks of the power distribution module; and
when installed to the network device by way of the power distribution module, provides power to the network device that forwards traffic within the network.

2. The apparatus of claim 1, wherein the series of interlock blocks of the power distribution module ensure that all power supply modules installed to the network device by way of the power distribution module have electrical ratings that satisfy the certain threshold.

3. The apparatus of claim 2, wherein:
the power distribution module has an electrical rating that matches the certain threshold;
the power distribution module is designed to handle Alternating Current (AC) power; and
the power supply module is designed to handle AC power.

4. The apparatus of claim 2, wherein:
the power distribution module has an electrical rating that matches the certain threshold;
the power distribution module is designed to handle Direct Current (DC) power; and
the power supply module is designed to handle DC power.

5. The apparatus of claim 1, wherein the power supply module comprises a universal power supply module designed to handle both AC power and DC power.

6. The apparatus of claim 1, wherein the series of interlock blocks of the power distribution module form a series of gaps that are sized to:
accept compatible power supply modules whose electrical ratings satisfy the certain threshold; and
reject incompatible power supply modules whose electrical ratings do not satisfy the certain threshold.

7. The apparatus of claim 6, wherein the compatible power supply modules each have at least one of:
a voltage rating that coincides with a voltage rating of the power distribution module; and
a power type that coincides with a power type of the power distribution module.

8. The apparatus of claim 6, wherein the interlock blocks of the power distribution module prevent the power supply module from being installed to the network device by rejecting the flange of the power supply module due at least in part to the size of the flange exceeding the size of the gaps formed by the interlock blocks.

9. The apparatus of claim 6, wherein the interlock blocks of the power distribution module enable the power supply module to be installed to the network device by accepting the flange of the power supply module due at least in part to the size of the gaps formed by the interlock blocks exceeding the size of the flange.

10. The apparatus of claim 1, further comprising a mechanical assembly bar physically coupled to the network device, wherein the mechanical assembly bar includes a configurable keying mechanism that:
when configured in a first position:
enables AC power distribution modules to be installed to the network device; and
prevents DC power distribution modules from being installed to the network device; and
when configured in a second position:
enables DC power distribution modules to be installed to the network device; and
prevents AC power distribution modules from being installed to the network device.

11. The apparatus of claim 10, wherein the configurable keying mechanism:
when configured in the first position:
enables AC power supply modules to be installed to the network device; and
prevents DC power supply modules from being installed to the network device; and
when configured in the second position:
enables DC power supply modules to be installed to the network device; and
prevents AC power supply modules from being installed to the network device.

12. The apparatus of claim 10, wherein the power supply module includes a key pin that is:
accepted by a receptacle of the mechanical assembly bar when the configurable keying mechanism is configured in one of the first and second positions; and
rejected by the configurable keying mechanism of the mechanical assembly bar when the configurable keying mechanism is configured in the other of the first and second positions.

13. A network device comprising:
at least one power distribution module that:
distributes power to the network device; and
includes a series of interlock blocks keyed to:
enable power supply modules whose electrical ratings satisfy a certain threshold to be installed to the network device; and
prevent other power supply modules whose electrical ratings do not satisfy the certain threshold from being installed to the network device; and
at least one power supply module that:
has an electrical rating that satisfies the certain threshold;
includes a flange that is keyed to fit between the interlock blocks of the power distribution module; and
when installed to the network device by way of the power distribution module, provides power to the network device.

14. The network device of claim 13, wherein the series of interlock blocks of the power distribution module form a series of gaps that are sized to:
accept compatible power supply modules whose electrical ratings satisfy the certain threshold; and
reject incompatible power supply modules whose electrical ratings do not satisfy the certain threshold.

15. The network device of claim 14, wherein the compatible power supply modules each have at least one of:

a voltage rating that coincides with a voltage rating of the power distribution module; and a power type that coincides with a power type of the power distribution module.

16. The network device of claim 14, wherein the interlock blocks of the power distribution module prevent the power supply module from being installed to the network device by rejecting the flange of the power supply module due at least in part to the size of the flange exceeding the size of the gaps formed by the interlock blocks.

17. The network device of claim 14, wherein the interlock blocks of the power distribution module enable the power supply module to be installed to the network device by accepting the flange of the power supply module due at least in part to the size of the gaps formed by the interlock blocks exceeding the size of the flange.

18. The network device of claim 13, further comprising a mechanical assembly bar physically coupled to the network device, wherein the mechanical assembly bar includes a configurable keying mechanism that:
 when configured in a first position:
  enables AC power distribution modules to be installed to the network device; and
  prevents DC power distribution modules from being installed to the network device; and
 when configured in a second position:
  enables DC power distribution modules to be installed to the network device; and
  prevents AC power distribution modules from being installed to the network device.

19. The network device of claim 18, wherein the configurable keying mechanism:
 when configured in the first position:
  enables AC power supply modules to be installed to the network device; and
  prevents DC power supply modules from being installed to the network device; and
 when configured in the second position:
  enables DC power supply modules to be installed to the network device; and
  prevents AC power supply modules from being installed to the network device.

20. A method comprising:
 disposing a series of interlock blocks across at least one power distribution module that distributes power to a network device that forwards traffic within a network;
 keying the interlock blocks to:
  enable power supply modules whose electrical ratings satisfy a certain threshold to be installed to the network device; and
  prevent other power supply modules whose electrical ratings do not satisfy the certain threshold from being installed to the network device; and
 creating, on a power supply module whose electrical rating satisfies the certain threshold, a flange keyed to fit between the interlock blocks of the power distribution module such that, when installed to the network device by way of the power distribution module, the power supply module is able to provide power to the network device that forwards traffic within the network.

* * * * *